United States Patent

Piltingsrud

[11] 3,993,950
[45] Nov. 23, 1976

[54] CARBON FIBER ELECTROMETER FOR DOSIMETER

[76] Inventor: Harley V. Piltingsrud, 522 Grand Ave., Dayton, Ohio 45405

[22] Filed: June 6, 1975

[21] Appl. No.: 584,567

[52] U.S. Cl. .............................. 324/109; 250/378
[51] Int. Cl.² .......................................... G01R 5/32
[58] Field of Search ............ 324/109; 250/376, 377, 250/378; 423/447, 448

[56] References Cited
UNITED STATES PATENTS

| | | | |
|---|---|---|---|
| 2,793,297 | 5/1957 | Siebentritt, Jr. et al. | 250/378 |
| 3,671,192 | 6/1972 | Ezekiel | 423/447 |

Primary Examiner—R. V. Rolinec
Assistant Examiner—Ernest F. Karlsen
Attorney, Agent, or Firm—Joseph E. Rusz; Robert Kern Duncan

[57] ABSTRACT

An electrometer for conventional pocket radiation dosimeters is disclosed in which the moving element of the electrometer is a carbon fiber. The fiber is spun from polyacrylonitrile homopolymer yarn and has a diameter of approximately 7 microns before carbonization. The polyacrylonitrile homopolymer fiber is conventionally preoxidized at approximately 270° C before conventional carbonization at approximately 1200° C. The resulting working fiber has a round cross sectional diameter of approximately 4 microns and a modulus of elasticity of approximately 15,000,000 psi. The fiber is mounted in a conventionally loop shaped electrometer frame by crimping the ends of the fiber into tabs on the frame.

2 Claims, 5 Drawing Figures

U.S. Patent Nov. 23, 1976 3,993,950
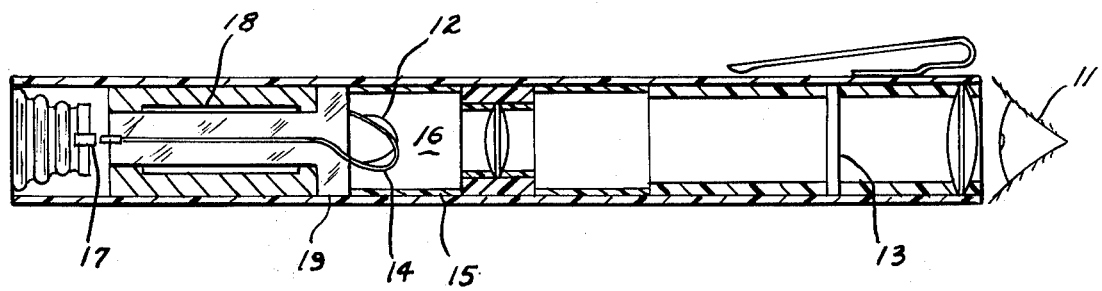
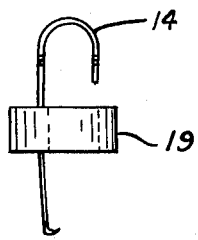 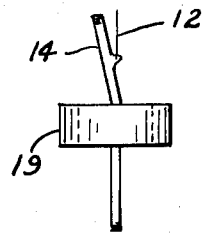
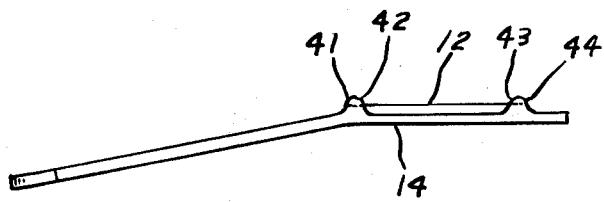 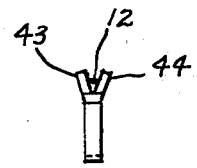

CARBON FIBER ELECTROMETER FOR DOSIMETER

RIGHTS OF THE GOVERNMENT

The invention described herein may be manufactured and used by or for the Government of the United States for all governmental purposes without the payment of any royalty.

BACKGROUND OF THE INVENTION

The field of the invention is in the electrometer art for dosimeters.

Electroscopes or electrometers, when combined with ionization chambers, are well known for measuring ionizing radiation field dose rates, and accumulated doses to objects within those fields. The conventional device is termed a dosimeter and the conventional unit of measurement is the roentgen or rad. Substantially all prior devices have electrometers having a movable element fabricated from a quartz fiber made electrically conductive (metallized) by depositing a metallic coating (usually gold or platinum) on the quartz fiber. Typical examples of prior art devices are disclosed by U.S. Pat. Nos. 2,613,327 to patentess A. O. Beckman et al.; 2,687,480 to patentees F. R. Shonka et al.; 2,806,960 to patentee R. P. Henderson; 3,396,337 to patentees R. Hosemann et al.; and 3,851,248 to patentee John J. Spokas.

Considerable difficulty has been experienced with the metallized quartz fibers. Flaking or scratching of the metallic coating has been a serious problem. The reproducibility of the diameter of the fiber and the obtaining of an even coating on the fiber has been a problem. A space charge condition will build up on any nonconductive areas of the fiber surface and cause erratic and nonlinear motion of the fiber. In some instances shock or continued bending of the fiber has caused the metallic coating to flake shortening the life of the instrument. The ranges of elasticity moduli of the quartz fiber has been relatively restricted, thus imposing greater component ranges in other parts of the system to provide instruments of difference ranges of sensitivity.

In search for high strength and high modulus materials, extensive work has been done in connection with carbon and graphite fibers. Typical examples of this art are U.S. Pat. Nos. 3,671,192 and 3,635,675 to patentee H. M. Ezekiel, U.S. Pat. No. 3,285,696 to patentee Tsunoda, and U.S. Pat. No. 3,412,062 to patentees Johnson et al. Additional information may also be found in the publications "Applied Polymer Symposium" No. 21 (1973) pages 167–178, published in 1973 by John Wiley & Sons, Inc., and "Science of Advanced Materials and Processes" Vol. 18, April 1973, pages 184–201, published by Society of Aerospace Material and Process Engineering.

SUMMARY OF THE INVENTION

An improved electrometer for radiation dosimeters is provided by fabricating the moving element of the electrometer from a very fine round carbon filament. The carbon fiber is naturally electrically conductive eliminating any need for applying a conductive coating to a nonconductive fiber as in the prior art. The charge problem associated with uneven coating and coating flaking is also eliminated. The carbon fiber electrometer is more economical to manufacture, reproducibility is better, and longer life is provided over the conventional devices. In addition, the optical qualities of the graphite fiber are greatly superior to metallized quartz, greatly improving the readability of the instrument by manually observing optically the position of the hairline occasioned by the image of the fiber on a translucent scale.

BRIEF DESCRIPTION OF THE DRAWING

FIG. 1 is a simplified schematic sectional view of a typical dosimeter;

FIG. 2 is a front view of a typical aluminum electrometer frame member in a supporting insulating member;

FIG. 3 is a side view of the frame member and support shown in FIG. 2 with a representative carbon fiber as in a partially charged electrometer;

FIG. 4 is a representative frame member with a carbon fiber in place before forming into a loop; and FIG. 5 is an enlarged end view of the frame and fiber shown in FIG. 4 before crimping the fiber with the frame tabs.

DESCRIPTION OF THE PREFERRED EMBODIMENT

FIG. 1 shows schematically a cross section of a typical dosimeter for indicating a radiation dose reading in roentgens. The eye 11 of an observer sees the image of the movable fiber 12 on a translucent scale 13 indicating the position of the fiber 12. The fiber 12 is supported by a frame 14. The fiber 12 and the frame 14 are electrically conductive and when an electrical charge is placed on them they will be of the same polarity, repelling each other. The other polarity of charge resides on the wall 15 of the ion chamber 16. The movable fiber element 12, and the frame 14, constitute an electrometer indicating magnitude of electrical charge. Before usage the proper magnitude of charge is induced through disconnecting switch 17 to the frame 14 and fiber 12, from an external potential source, such that the fiber 12 moves away from the frame 14 sufficiently to place the image of the fiber on the zero indication of the scale 13. In the presence of ionizing radiation, radiation will penetrate the ion chamber 16 and discharge the electrometer in proportion to the amount of ionizing radiation the chamber is exposed to. As the electrometer discharges, the fiber 12 moves closer and closer to the frame member 14 and the shadow of the fiber moves up the scale 13 indicating a higher and higher value of accumulated radiation dose. Various magnitudes of capacitance 18 are built into the instrument to provide different ranges of indication. That is, with the electrical potential between the frame and fiber, and the wall of the electrometer supplied from a larger capacitance, more ionizing radiation has to enter the ion chamber 16 to discharge the capacitor to a given electrical potential.

The foregoing applies to the prior art as well as this invention as this invention resides in the combination of structural elements to form only the electrometer component of the dosimeter. In the prior art devices the movable element 12 of the electrometer has been fabricated from a metal coated quartz fiber. The quartz fiber and its metal coat, as previously mentioned, is fragile and subject to flaking. Once the metal is gone from the fiber, that portion of the fiber becomes an insulator rather than a conductor for electrical charge. This greatly deteriorates the instrument. Securing the metallized quartz fiber to the frame member has been difficult. Common practice has been to use a conductive cement such as dag to assist in establishing good contact between the frame and the quartz fiber without damaging the metal coating on the fiber.

I have found that an improved electrometer for a dosimeter can be provided as illustrated in FIGS. 2, 3, 4, and 5, by forming the movable element 12 from a carbon fiber and securing it to the frame by crimping tab members 41, 42, 43, and 44, formed integral with the frame, over the ends of the carbon fiber. The carbon fiber is inherently electrically conductive throughout, therefore, no metal coating or conductive cement is needed. Also it is not easily damaged by any deformation occurring to the fiber by crimping in the frame tabs. It has been found to be generally preferrable to form the frame member 14 in one piece as shown in FIG. 4. A slit or recess is formed in the protrusions to provide two tabs at each location. The carbon fiber 12 is positioned in the slit and the tabs 41 and 42 squeezed down over the fiber. The fiber is then stretched taut enough to remove any appreciable sag and secured at the other end by bending tabs 43 and 44 toward each other crimping them down over the fiber and holding it in place. The view shown in FIG. 5 is before the bending of the ends of the tabs 43 and 44 toward each other, crimping the fiber in place. After the assembly of the fiber in the frame is made with the frame in the straight shape, the frame (with the fiber) is bent in to the conventional loop structure as shown in FIGS. 2 and 3 and positioned in the insulator member 19. The assembly is then installed in dosimeter in the conventional manner.

The carbon fiber is preferably prepared from substantially pure PAN (polyacrylonitrile homopolymer) yarn having a diameter of approximately seven microns before carbonization. Generally a carbon fiber is preferred to a graphite fiber since flexibility is of primary desirability rather than high strength. A typical conventional suitable carbonization is to batch preoxidize the yarn at approximately 270° C in an oxygen-containing atmosphere for a time sufficient to blacken the fiber, approximately two to three hours is generally satisfactory. The blackened fiber is then heated in a nitrogen atmosphere at approximately 1200° C for approximately one hour. Since extremely high tensil strength is not necessary for this invention, the times and temperatures are not critical. The typical carbon fiber has a finished diameter of approximately four microns and an elasticity modulus of approximately 15,000,000 psi.

1. An electrometer for a dosimeter comprising:
 a. an electrically conductive electrometer frame having bendable tabs;
 b. an approximately seven micron polyacrylonitrile homopolymer yarn fiber carbonized to provide a flexible conductive carbon fiber; and
 c. the said carbon fiber attached to the said frame by the said bendable tabs.

2. The electrometer as claimed in claim 1 wherein the said fiber has a diameter after carbonization of approximately four microns and an elasticity modulus of approximately 15,000,000 psi.

* * * * *